(12) United States Patent
Min et al.

(10) Patent No.: US 9,042,690 B2
(45) Date of Patent: May 26, 2015

(54) HYBRID LASER LIGHT SOURCES FOR PHOTONIC INTEGRATED CIRCUITS

(75) Inventors: Bok-ki Min, Suwon-si (KR); Taek Kim, Seongnam-si (KR); Young-soo Park, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 169 days.

(21) Appl. No.: 13/614,432

(22) Filed: Sep. 13, 2012

(65) Prior Publication Data

US 2013/0188904 A1    Jul. 25, 2013

(30) Foreign Application Priority Data

Jan. 20, 2012    (KR) .................. 10-2012-0006808

(51) Int. Cl.
*G02B 6/34* (2006.01)
*H01S 3/08* (2006.01)
*H01S 5/183* (2006.01)
*H01S 3/00* (2006.01)
*H01S 5/20* (2006.01)

(52) U.S. Cl.
CPC ........... *H01S 5/18358* (2013.01); *H01S 5/2031* (2013.01); *H01S 5/2018* (2013.01)

(58) Field of Classification Search
CPC ............ H01S 5/18308; H01S 5/18319; H01S 5/18325; H01S 5/18338; H01S 5/18358; H01S 5/18316; H01S 5/18391; H01S 5/18394; H01S 5/2027; H01S 5/2031; H01S 5/2045
USPC ........................................................ 372/103
See application file for complete search history.

(56) References Cited

U.S. PATENT DOCUMENTS 5,915,165 A * 6/1999 Sun et al. ................. 438/47
8,116,171 B1 * 2/2012 Lee ....................... 369/13.01
8,257,990 B2 * 9/2012 Koch ........................ 438/31
8,451,695 B2 * 5/2013 Olson .................... 369/13.01

(Continued)

FOREIGN PATENT DOCUMENTS

EP    2 525 450 A1    11/2012
JP    2006351917 A    12/2006

(Continued)

OTHER PUBLICATIONS

Extended Search Report issued n EP 12197785.4-1564/2618434 dated Jan. 30, 2014.

(Continued)

*Primary Examiner* — Rhonda Peace
(74) *Attorney, Agent, or Firm* — Harness, Dickey & Pierce, PLC

(57) ABSTRACT

A light source for a photonic integrated circuit may comprise a reflection coupling layer formed on a substrate in which an optical waveguide is provided, at least one side of the reflection coupling layer being optically connected to the optical waveguide; an optical mode alignment layer provided on the reflection coupling layer; and/or an upper structure provided on the optical mode alignment layer and including an active layer for generating light and a reflection layer provided on the active layer. A light source for a photonic integrated circuit may comprise a lower reflection layer; an optical waveguide optically connected to the lower reflection layer; an optical mode alignment layer on the lower reflection layer; an active layer on the optical mode alignment layer; and/or an upper reflection layer on the active layer.

31 Claims, 9 Drawing Sheets

(56) References Cited

U.S. PATENT DOCUMENTS

| | | | |
|---|---|---|---|
| 2002/0110169 A1* | 8/2002 | Iwai et al. | 372/43 |
| 2003/0103542 A1* | 6/2003 | Cox et al. | 372/96 |
| 2003/0185269 A1 | 10/2003 | Gutin | |
| 2010/0142580 A1* | 6/2010 | Gilet et al. | 372/50.11 |
| 2012/0008658 A1* | 1/2012 | Chung | 372/45.01 |
| 2013/0105840 A1* | 5/2013 | Min et al. | 257/98 |
| 2013/0188904 A1* | 7/2013 | Min et al. | 385/14 |
| 2014/0098833 A1* | 4/2014 | Kim et al. | 372/44.011 |
| 2014/0198815 A1* | 7/2014 | Chung | 372/38.02 |
| 2014/0219301 A1* | 8/2014 | Chung | 372/28 |

FOREIGN PATENT DOCUMENTS

| | | |
|---|---|---|
| JP | 2007079283 A | 3/2007 |
| JP | 2008064915 A | 3/2008 |
| KR | 20040059627 A | 7/2004 |
| WO | WO 2010/091688 A1 | 8/2010 |

OTHER PUBLICATIONS

Chung Il-Sug et al., "Silicon-photonics light source realized by III-V/Si-grating-mirror laser", Applied Physics Letters, vol. 97, No. 15, Oct. 15, 2010, pp. 151113-1 to 151113-3, XP012137229.

* cited by examiner

HYBRID LASER LIGHT SOURCES FOR PHOTONIC INTEGRATED CIRCUITS

CROSS-REFERENCE TO RELATED APPLICATION(S)

This application claims priority from Korean Patent Application No. 10-2012-0006808, filed on Jan. 20, 2012, in the Korean Intellectual Property Office (KIPO), the entire contents of which are incorporated herein by reference.

BACKGROUND

1. Field

Example embodiments may relate to methods and/or apparatuses for hybrid laser light sources for photonic integrated circuits. Example embodiments also may relate to hybrid laser light sources for photonic integrated circuits for supplying light to photonic integrated circuits.

2. Description of Related Art

In data transmission, electrical connection using metal wiring is disadvantageous to a system design because it consumes high power as a transmission loss increases at a high frequency range and due to an electromagnetic interference (EMI) phenomenon. In contrast, in an optical interconnect technology for exchanging data by using light, the transmission loss and the EMI phenomenon are low and thus high speed, high bandwidth data communications systems may be realized.

The optical interconnect technology is widely being researched as short distance and very short distance data communications methods. The optical interconnect technology for exchanging data at a level of system-to-system, module-to-module, package-to-package, chip-to-chip, on-chip, etc., are being developed.

To realize short distance and very short distance data communications methods at a level of chip-to-chip, on-chip, etc., studies on a silicon based photonic integrated circuit for integrating various optical elements such as a light source, an optical waveguide, an optical modulator, an optical filter, a photodetector, etc., are actively being performed. In particular, a study on a light source for supplying light to a photonic integrated circuit is actively being performed.

SUMMARY

Example embodiments may provide methods and/or apparatuses for hybrid laser light sources for photonic integrated circuits that may increase a coupling efficiencies of resonance modes of resonators and/or waveguide modes of optical waveguides and/or in which accurate optical mode alignments are possible in chip bonding.

In some example embodiments, a light source for a photonic integrated circuit may comprise a reflection coupling layer formed on a substrate in which an optical waveguide is provided, at least one side of the reflection coupling layer being optically connected to the optical waveguide; an optical mode alignment layer provided on the reflection coupling layer; and/or an upper structure provided on the optical mode alignment layer and including an active layer for generating light and a reflection layer provided on the active layer.

In some example embodiments, the optical mode alignment layer may comprise a higher refractive index area arranged at a center portion and a lower refractive index area arranged around the higher refractive index area.

In some example embodiments, the higher refractive index area and the lower refractive index area may have a refractive index difference by which optical confinement is achieved in the higher refractive index area.

In some example embodiments, the higher refractive index area may have a circular, oval, or polygonal shape.

In some example embodiments, the lower refractive index area may have a band shape surrounding the higher refractive index area.

In some example embodiments, an area outside the lower refractive index area of the optical mode alignment layer may be formed of a same material as the higher refractive index area.

In some example embodiments, the lower refractive index area may have a width that is equal to or greater than a wavelength of light used for the light source.

In some example embodiments, an overall area outside the higher refractive index area of the optical mode alignment layer may be formed as the lower refractive index area.

In some example embodiments, the higher refractive index area may be formed of silicon. The lower refractive index area may be formed of a silicon oxide or air.

In some example embodiments, the higher refractive index area may be formed of a silicon oxide. The lower refractive index area may be formed of air.

In some example embodiments, the active layer of the upper structure may be based on a III-V compound semiconductor. At least one of the substrate, the reflection coupling layer, and the optical mode alignment layer may be based on silicon.

In some example embodiments, the upper structure may be coupled to the optical mode alignment layer by wafer bonding in a substrate shape or coupled to the optical mode alignment layer by chip bonding in a chip shape.

In some example embodiments, the reflection coupling layer may function as a lower reflection layer with respect to the reflection layer of the upper structure. The reflection coupling layer may be a high index contrast grating reflection layer having a one-dimensional grating structure.

In some example embodiments, the reflection coupling layer may be formed of a material including silicon in a one-dimensional grating structure.

In some example embodiments, an insulation layer may be provided on an upper surface of the substrate. The gap layer, the reflection coupling layer, and the optical waveguide may be provided on the insulation layer.

In some example embodiments, the light source may further comprise a gap layer that is provided between the reflection coupling layer and the optical mode alignment layer; and/or has a refractive index lower than those of the reflection coupling layer and the optical waveguide.

In some example embodiments, the gap layer may comprise silicon oxide.

In some example embodiments, a light source for a photonic integrated circuit may comprise a reflection coupling layer formed on a substrate in which an optical waveguide is provided, at least one side of the reflection coupling layer being optically connected to the optical waveguide; a gap layer provided on the reflection coupling layer; an optical mode alignment layer provided on the gap layer; and/or an upper structure provided on the optical mode alignment layer and including an active layer based on a III-V compound semiconductor for generating light and a reflection layer provided on the active layer, the upper structure being coupled to the optical mode alignment layer by bonding. The substrate may be a silicon substrate comprising an insulation layer on an upper surface thereof. The optical waveguide and the reflection coupling layer are provided on an upper surface of the insulation layer. At least one of the optical waveguide, the reflection coupling layer, and the optical mode alignment layer may be based on silicon. The optical mode alignment layer may comprise a higher refractive index area arranged at a center portion and a lower refractive index area arranged around the higher refractive index area.

In some example embodiments, the higher refractive index area and the lower refractive index area may have a refractive index difference by which optical confinement is achieved in the higher refractive index area.

In some example embodiments, the lower refractive index area may have a width that is equal to or greater than a wavelength of light used for the light source.

In some example embodiments, the higher refractive index area of the optical mode alignment layer may be formed of silicon. The lower refractive index area may be formed of a silicon oxide or air.

In some example embodiments, the higher refractive index area of the optical mode alignment layer may be formed of a silicon oxide. The lower refractive index area may be formed of air.

In some example embodiments, the reflection coupling layer may function as a lower reflection layer with respect to the reflection layer of the upper structure. The reflection coupling layer may be a high index contrast grating reflection layer having a one-dimensional grating structure.

In some example embodiments, a photonic integrated circuit may comprise a substrate; an optical waveguide formed on the substrate; and/or a light source configured to generate light and/or configured to transmit the light through the optical waveguide.

In some example embodiments, the optical mode alignment layer may comprise a higher refractive index area arranged at a center portion and a lower refractive index area arranged around the higher refractive index area.

In some example embodiments, a photonic integrated circuit may comprise a substrate; an optical waveguide formed on the substrate; and/or a light source configured to generate light and/or configured to transmit the light through the optical waveguide.

In some example embodiments, a method of manufacturing a light source for a photonic integrated circuit may comprise forming an optical waveguide and a reflection coupling layer, having at least one side optically connected to the optical waveguide, on a substrate; forming an optical mode alignment layer on the reflection coupling layer; and/or coupling an upper structure, including an active layer configured to generate light and a reflection layer provided on the active layer, to the optical mode alignment layer by wafer bonding or chip bonding.

In some example embodiments, the optical mode alignment layer may comprise a higher refractive index area arranged at a center portion and a lower refractive index area arranged around the higher refractive index area.

In some example embodiments, a method of manufacturing the light source for a photonic integrated circuit may comprise forming an optical waveguide and a reflection coupling layer, having at least one side optically connected to the optical waveguide, on a substrate; forming an optical mode alignment layer on the reflection coupling layer; and/or coupling an upper structure, including an active layer for generating light and a reflection layer provided on the active layer, to the optical mode alignment layer by wafer bonding or chip bonding.

In some example embodiments, a light source for a photonic integrated circuit may comprise a substrate; a reflection coupling layer on the substrate; an optical waveguide on the substrate; an optical mode alignment layer on the reflection coupling layer; an active layer on the optical mode alignment layer; and/or a reflection layer on the active layer. The reflection coupling layer may be optically connected to the optical waveguide.

In some example embodiments, the light source may further comprise an insulating layer between the substrate and the reflection coupling layer.

In some example embodiments, the light source may further comprise an insulating layer between the substrate and the optical waveguide.

In some example embodiments, the light source may further comprise a gap layer between the reflection coupling layer and the optical mode alignment layer.

In some example embodiments, a photonic integrated circuit may comprise the light source.

In some example embodiments, a light source for a photonic integrated circuit may comprise a lower reflection layer; an optical waveguide optically connected to the lower reflection layer; an optical mode alignment layer on the lower reflection layer; an active layer on the optical mode alignment layer; and/or an upper reflection layer on the active layer.

In some example embodiments, the light source may further comprise a gap layer between the lower reflection layer and the optical mode alignment layer.

In some example embodiments, a photonic integrated circuit may comprise the light source.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
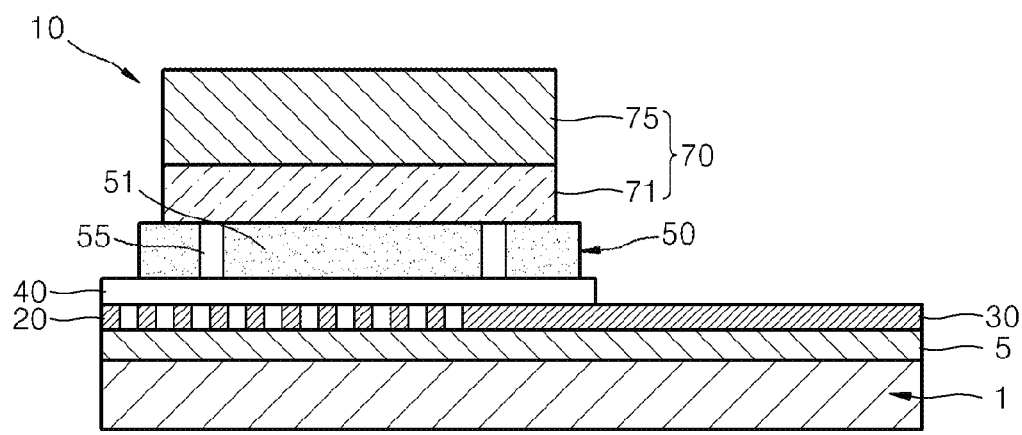
FIG. 1 is a cross-sectional view schematically illustrating a light source of a photonic integrated circuit according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

It is difficult to make a laser directly using silicon that is an indirect transition semiconductor. Accordingly, a variety of methods to supply light to a silicon-based photonic integrated circuit are being studied. A III-V compound semiconductor laser is used as a light source of an optical interconnect system. When an external III-V compound semiconductor laser is used to input light to a silicon-based photonic integrated circuit, optical alignment is difficult and lots of time and costs are consumed.

A technology for making a III-V compound semiconductor/silicon hybrid laser by bonding a III-V compound semiconductor resonator to a silicon-based photonic integrated circuit is under development. That is, a III-V compound semiconductor/silicon hybrid laser light source obtained by bonding a resonator of a vertical-cavity surface-emitting laser (VCSEL) to a silicon-on-insulator (SOI) based photonic integrated circuit is being developed. A VCSEL resonator has a structure including an upper mirror layer and an active layer and at least a partial structure of a lower mirror layer may be formed at a substrate where a photonic integrated circuit is provided. A hybrid laser light source using a VCSEL has merits in low power consumption and high-speed direct modulation.

A coupling efficiency is a value used to indicate a rate at which a III-V compound semiconductor/silicon hybrid laser light source propagates light to an optical waveguide in a planar direction of a photonic integrated circuit. When the coupling efficiency is low, most of light is emitted in a downward direction perpendicular to a photonic integrated circuit. Thus, the coupling efficiency is one of the most important factors for determining performance of a hybrid laser light source.

The coupling efficiency is much affected by an alignment position between a resonant mode of a VCSEL resonator and a waveguide mode of an optical waveguide in a planar direction. When a III-V compound semiconductor/silicon hybrid laser structure is manufactured by using a semiconductor process having high accuracy and precision after wafer bonding using a wafer bonding technology, accurate and precise optical mode alignment is possible. Although the wafer bonding technology provides accurate and precise mode alignment, most of a III-V compound semiconductor area, except for a VCSEL area, may not be used. A III-V compound semiconductor substrate is expensive compared to a silicon substrate and a metal-organic chemical vapor deposition (MOCVD) for growing a VCSEL structure is a costly process. A III-V compound semiconductor/silicon hybrid laser light source using the wafer bonding technology is expensive in terms of a manufacturing cost. Also, since mode alignment is a thing to consider first when manufacturing a VCSEL structure after wafer bonding, there is a limit in designing a VCSEL structure.

A chip bonding technology to directly bond an individual VCSEL chip to a necessary area in a photonic integrated circuit has a merit of a low cost in terms of a manufacturing cost compared to the wafer bonding technology because a VCSEL may be made by using an overall area of a III-V compound semiconductor substrate and an individual VCSEL may be bonded to many photonic integrated circuits.

However, since accuracy and precision of the chip bonding technology are within a scope of about several micrometers, it is difficult to accurately perform optical mode alignment of a VCSEL resonator having a planar direction size of about several micrometers by chip-bonding the VCSEL resonator to a photonic integrated circuit that uses an optical waveguide having a size of about hundreds of nanometers to several micrometers. A coupling efficiency of a resonance mode of the VCSEL resonator and a waveguide mode of the optical waveguide varies much according to relative positions of the VCSEL resonator, the optical waveguide of the photonic integrated circuit, and an auxiliary coupling structure.

Thus, to be used as a photonic integrated circuit light source, optical mode alignment is appropriately performed so as to effectively emit a laser beam to an optical waveguide. A hybrid laser light source for a photonic integrated circuit according to some example embodiments is provided to obtain accurate optical mode alignment during chip bonding.

A hybrid laser light source for a photonic integrated circuit according to some example embodiments is described in detail with reference to the accompanying drawings. The below-described hybrid laser light source for a photonic integrated circuit according to some example embodiments has a structure for increasing a coupling efficiency of a resonance mode of a resonator and a waveguide mode of an optical waveguide. The hybrid laser light source for a photonic integrated circuit is capable of performing accurate optical mode alignment during chip bonding. Accordingly, by using a chip bonding technology, a III-V compound semiconductor/silicon hybrid laser light source for a photonic integrated circuit may be embodied at a low manufacturing cost.

Figure 2:
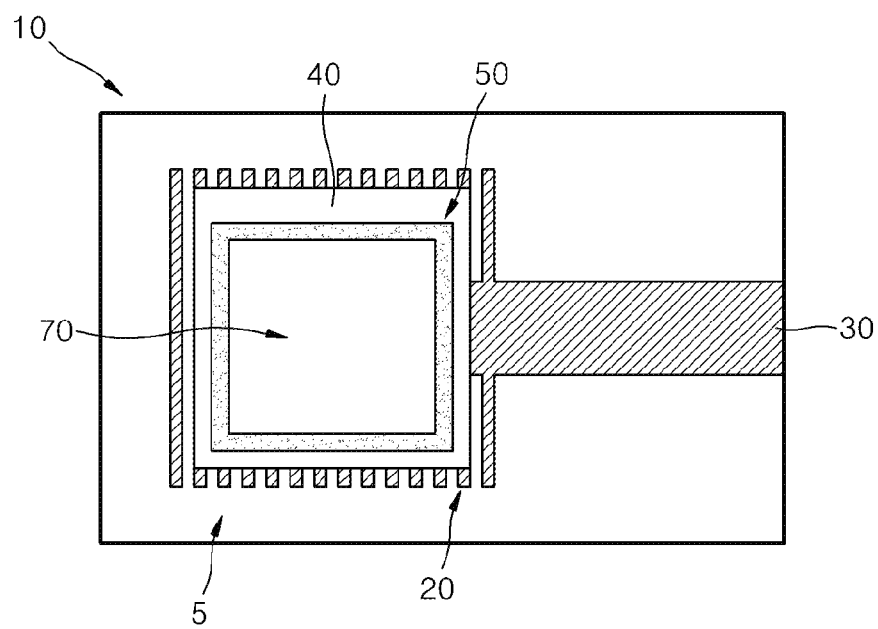
FIG. 2 is a plan view schematically illustrating a light source of a photonic integrated circuit according to some example embodiments.

FIG. 1 is a cross-sectional view schematically illustrating a light source of a photonic integrated circuit according to some example embodiments. FIG. 2 is a plan view schematically illustrating a light source of a photonic integrated circuit according to some example embodiments.

Referring to FIGS. 1 and 2, a light source 10 for a photonic integrated circuit according to the present embodiment includes a reflection coupling layer 20 formed on a substrate 1 where an optical waveguide 30 is provided, an optical mode alignment layer 50 provided on the reflection coupling layer 20, and an upper structure 70 provided on the optical mode alignment layer 50. The upper structure 70 is a VCSEL resonator and includes an active layer 71 for generating light and a reflection layer 75 formed thereon. A gap layer 40 may be further provided between the reflection coupling layer 20 and the optical mode alignment layer 50.

The substrate 1 may include an insulation layer 5 on an upper surface thereof. The optical waveguide 30 and the reflection coupling layer 20 may be formed on the insulation layer 5. The substrate 1 may be a silicon substrate, for example, a lower silicon substrate of an SOI substrate. In this case, the insulation layer 5 may be a silicon oxide (SiO2) layer. Also, the insulation layer 5 may be formed of an insulation material including at least one of ZrO2, TiO2, MgO, CeO2, Al2O3, HfO2, NbO, and Si3N4. The type of an insulation material of the insulation layer 5 may vary according to a characteristic of a material of the optical waveguide 30 and may have a refractive index lower than that of the optical waveguide 30.

Optical elements for a photonic integrated circuit may be integrated on the substrate 1. The photonic integrated circuit may include the substrate 1, the optical waveguide 30 formed on the substrate 1, and the light source 10 according to some example embodiments for generating light to be transferred through the optical waveguide 30. In addition, the photonic integrated circuit may further include various optical elements to be integrated on the substrate 1.

The substrate 1 may be a substrate of a different type, for example, a GaAs substrate. That is, in the light source 10 according to some example embodiments, the active layer 71 of the upper structure 70 is based on a III-V compound semiconductor and at least one of the substrate 1, the reflection coupling layer 20, and the optical mode alignment layer 50 is based on silicon. Thus, a III-V compound semiconductor/silicon hybrid laser light source for a photonic integrated circuit may be realized. However, example embodiments are not limited thereto and, for example, a GaAs substrate may be used as the substrate 1.

The reflection coupling layer 20 is provided on the substrate 1 or on the insulation layer 5 when the insulation layer 5 is provided on the substrate 1, such as in an SOI substrate, such that at least one side of the reflection coupling layer 20 may be optically connected to the optical waveguide 30. The reflection coupling layer 20 functions as a lower reflection layer with respect to the reflection layer 75 of the upper structure 70, and couples light to the optical waveguide 30. The reflection coupling layer 20 may be formed as a high index contrast grating reflection layer having a one-dimensional grating structure. That is, the reflection coupling layer 20 may have a structure in which a plurality of bars are arranged to be separated from each other in a constant interval. For example, the reflection coupling layer 20 may be formed of a material including silicon in a one-dimensional grating structure. The reflection coupling layer 20 may be formed by forming a silicon layer on the insulation layer 5 and patterning the silicon layer in a one-dimensional grating structure.

The reflection coupling layer 20 excites an optical mode having a component proceeding in a planar direction, that is, a direction parallel to a surface of the substrate 1, due to a structural characteristic. The optical mode excited by the one-dimensional grating structure and proceeding in a planar direction is coupled to the optical waveguide 30 connected to the reflection coupling layer 20, and propagated.

The reflection coupling layer 20 may have a high reflectance by appropriately controlling a grating cycle, the width and height of each bar, the thickness of the insulation layer 5, and/or the thickness of the gap layer 40. For example, the reflection coupling layer 20 may have a reflectance of about 99.9% or higher.

The gap layer 40 overlaps the reflection coupling layer 20 and may overlap a partial area of the optical waveguide 30. The gap layer 40 may have a refractive index lower than those of the reflection coupling layer 20 and the optical waveguide 30. As such, since the gap layer 40 is formed to have a relatively low refractive index, the reflectance of the reflection coupling layer 20 may be increased. Also, light propagated by being coupled between the reflection coupling layer 20 and the optical waveguide 30 may be well propagated along the optical waveguide 30. The gap layer 40 may be formed of an insulation material. The gap layer 40 may be a layer formed of, for example, a material including silicon oxide (SiO2). Also, the gap layer 40 may be formed of a material including at least one of ZrO2, TiO2, MgO, CeO2, Al2O3, HfO2, NbO, and Si3N4.

In order to make light in a planar directional optical mode excited by the reflection coupling layer 20 well coupled to the optical waveguide 30 in a planar direction, an optical resonance mode obtained by an overall resonator of a layered structure of the reflection layer 75 of the upper structure 70 and the reflection coupling layer 20 and an optical waveguide mode of the optical waveguide 30 are well aligned to each other. This is because a coupling efficiency of a resonance mode of a resonator and a waveguide mode of the optical waveguide 30 may vary much according to relative positions of the resonator and the optical waveguide 30 of a photonic integrated circuit or an auxiliary coupling structure. When optical mode alignment is inappropriately performed, light may not be appropriately transmitted to the optical waveguide 30. Thus, to make the light source 10 appropriately function as a light source of a photonic integrated circuit, the optical mode alignment is to be appropriately performed.

To make light well coupled to the optical waveguide 30 in a planar direction, an optical resonance mode of a resonator and an optical waveguide mode of the optical waveguide 30 are accurately aligned. For convenience of explanation, the term "resonator" is used as a concept including a VCSEL resonator including the upper structure 70, that is, the active layer 71 and the reflection layer 75, and the reflection coupling layer 20 functioning as a lower mirror layer with respect to the VCSEL resonator. Also, the term "upper structure 70", that is, the VCSEL resonator, is used as a concept including the active layer 71 and the reflection layer 75 functioning as an upper mirror layer. Since accuracy and precision of a chip bonding technology range about several micrometers, it is difficult to accurately perform optical mode alignment of the VCSEL resonator having a size of about several micrometers in a planar direction on a photonic integrated circuit using an optical waveguide having a size of about hundreds of nanometers to several micrometers by chip bonding.

However, according to the hybrid laser light source 10 for a photonic integrated circuit according to some example embodiments, since the optical mode alignment layer 50 is provided, a resonance mode of a resonator and a waveguide mode of the optical waveguide 30 may be accurately aligned even when the upper structure 70 is coupled by chip bonding. The optical mode alignment layer 50 forms a part of an overall resonator and may directly form an optical resonance mode and determine a mode type. The optical mode alignment layer 50 may be accurately aligned to the optical waveguide 30 by a semiconductor manufacturing process of forming a photonic integrated circuit. The type of a resonance mode in a vertical direction of the hybrid laser light source 10 for a photonic integrated circuit according to some example embodiments may be determined by the reflection coupling layer 20 functioning as a lower reflection layer, the optical mode alignment layer 50, and the upper structure 70, that is, a VCSEL resonator structure. Thus, the optical mode alignment layer 50 itself forms a part of a resonator and may determine the type of a lower optical resonance mode that is coupled to a waveguide mode of the optical waveguide 30.

Figure 3:
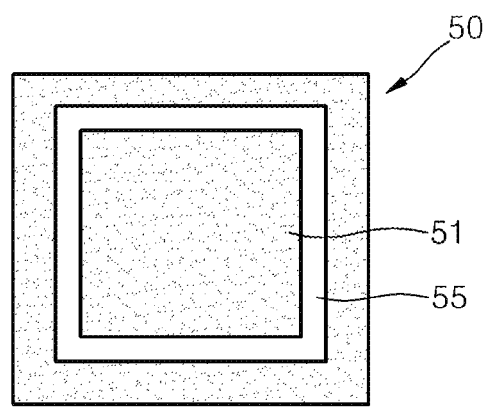
FIG. 3 is a plan view schematically illustrating an example of an optical mode alignment layer.

FIG. 3 is a plan view schematically illustrating an example embodiment of the optical mode alignment layer 50. FIG. 3 illustrates an example in which a low (or lower) refractive index area 55 is formed as a band surrounding a high (or higher) refractive index area 51.

Referring to FIG. 3, the optical mode alignment layer 50 may include the high refractive index area 51 located at a center portion of the optical mode alignment layer 50 and the low refractive index area 55 surrounding the high refractive index area 51. The low refractive index area 55 may be provided to surround the high refractive index area 51. The high refractive index area 51 at the center portion thereof may determine the type of an optical resonance mode of a resonator.

The high refractive index area 51 and the low refractive index area 55 may be formed to have a refractive index difference by which optical confinement is achieved. For example, the high refractive index area 51 may be formed to have a refractive index greater than that of the low refractive index area 55 by about 0.5 or 1 or higher.

For example, while the high refractive index area 51 may be formed of silicon, the low refractive index area 55 may be formed of a silicon oxide or a space filled with air or a vacuum space. Also, the high refractive index area 51 may be formed of a silicon oxide and the low refractive index area 55 may be a space filled with air or a vacuum space. In a wavelength range of about 1.31 μm, refractive indexes of silicon, a silicon oxide, and air are about 3.5, 1.5, and 1, respectively. Accordingly, in the above combinations, the high refractive index area 51 and the low refractive index area 55 may have a refractive index difference by which optical confinement is sufficiently achieved.

As such, when optical confinement is mainly achieved in the high refractive index area 51 due to a refractive index difference between the high refractive index area 51 and the low refractive index area 55, light generated by the active layer 71 of the upper structure 70 is mainly limited to within the high refractive index area 51 so as to be resonated between the reflection coupling layer 20 arranged at a lower side and the reflection layer 75 arranged at an upper side. Thus, an optical resonance area is mainly limited to within the high refractive index area 51.

In the meantime, in order for light generated by the active layer 71 of the upper structure 70 to be well limited to the high refractive index area 51, the low refractive index area 55 may be formed to roughly have a width equal to or greater than a wavelength used by the light source 10.

The optical mode alignment layer 50 having the above-described structure including the high refractive index area 51 and the low refractive index area 55 surrounding the high refractive index area 51 may be formed to be accurately aligned to the optical waveguide 30 by a semiconductor manufacturing process of forming a photonic integrated circuit and thus light limited to the high refractive index area 51 may be effectively coupled to the optical waveguide 30. That is, like the optical waveguide 30, when the optical mode alignment layer 50 is formed by a semiconductor manufacturing process, the high refractive index area 51 of the optical mode alignment layer 50 may be accurately and precisely manufactured and thus the optical mode alignment layer 50 may be accurately aligned to the optical waveguide 30.

Thus, even when the upper structure 70 is coupled to the optical mode alignment layer 50 such that the active layer 71 and the reflection layer 75 of the upper structure 70 cover the high refractive index area 51, the scope of light that resonates is limited to within the high refractive index area 51 and thus a resonance mode of a resonator and an optical waveguide mode of the optical waveguide 30 may be accurately aligned.

The coupling of the upper structure 70 to the optical mode alignment layer 50 such that the active layer 71 and the reflection layer 75 of the upper structure 70 cover the high refractive index area 51 may be generally generated when the upper structure 70 of a chip shape is chip-bonded. The existence of the optical mode alignment layer 50 may enable accurate alignment of a resonance mode of a resonator and an optical waveguide mode of the optical waveguide 30 when the upper structure 70 of a chip shape is coupled to the optical mode alignment layer 50 by chip bonding.

Thus, when the upper structure 70 of a chip shape is coupled to the optical mode alignment layer 50 by chip bonding, a resonance mode of a resonator and an optical waveguide mode of the optical waveguide 30 may be accurately aligned.

When the upper structure 70 is coupled by wafer bonding, the scope of resonance of light generated by the active layer 71 may be limited to the high refractive index area 51 of the optical mode alignment layer 50. Thus, a resonance mode of a resonator and an optical waveguide mode of the optical waveguide 30 may be accurately aligned.

According to the light source 10 according to some example embodiments, the upper structure 70 of a chip shape may be coupled to the optical mode alignment layer 50 by chip bonding. Also, the upper structure 70 may be coupled to the optical mode alignment layer 50 by wafer bonding.

In FIGS. 2 and 3, the high refractive index area 51 is formed in a square shape and the low refractive index area 55 is formed in a band shape surrounding the high refractive index area 51. In addition, the shape of the high refractive index area 51 may be variously changed and an overall shape may be changed to a variety of shapes while the low refractive index area 55 surrounds the high refractive index area 51.

For example, the high refractive index area 51 may have any of shapes such as a circle, an oval, and a polygon. The low refractive index area 55 may have a band shape surrounding the high refractive index area 51 or may be formed across an entire area outside the high refractive index area 51. Also, when the low refractive index area 55 has a band shape surrounding the high refractive index area 51, an area outside the low refractive index area 55 may be formed of the same material as the high refractive index area 51.

In FIG. 3, the optical mode alignment layer 50 has a structure including the high refractive index area 51 having a square shape, the low refractive index area 55 having a band shape surrounding the high refractive index area 51, and an area outside the low refractive index area 55 that is formed of the same material as the high refractive index area 51.

Figure 4:
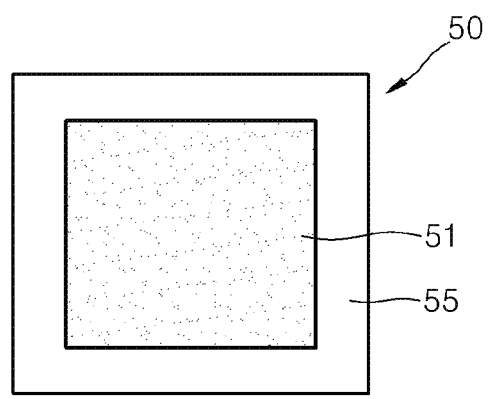
FIGS. 4 to 6 are plan views schematically illustrating other examples of optical mode alignment layers.

In FIG. 4, the optical mode alignment layer 50 has a structure including the high refractive index area 51 in a square shape and the low refractive index area 55 formed across an entire area outside of the high refractive index area 51 surrounding the high refractive index area 51.

Figure 5:
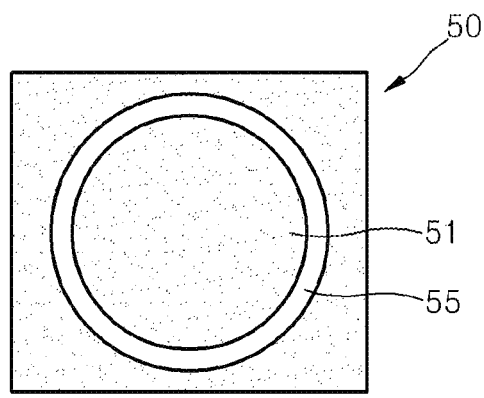

In FIG. 5, the optical mode alignment layer 50 has a structure including the high refractive index area 51 having a circular shape, the low refractive index area 55 having a band shape surrounding the high refractive index area 51, and an area outside the low refractive index area 55 that is formed of the same material as the high refractive index area 51.

Figure 6:
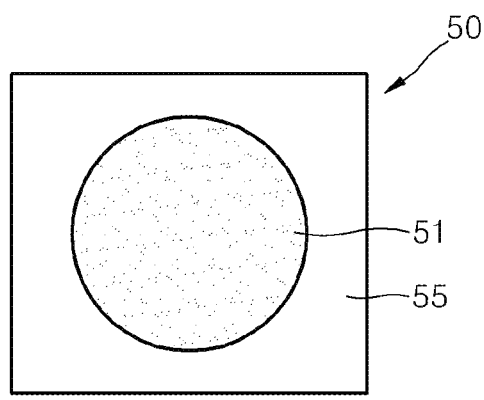

In FIG. 6, the optical mode alignment layer 50 has a structure including the high refractive index area 51 in a circular shape, and the low refractive index area 55 formed across an entire area outside of the high refractive index area 51 surrounding the high refractive index area 51.

As described above, the optical mode alignment layer 50 may be modified according to a variety of example embodiments.

According to the hybrid laser light source 10 for a photonic integrated circuit according to some example embodiments, the reflection coupling layer 20 and the optical mode alignment layer 50 form an overall VCSEL structure with the upper structure 70 to be bonded to an upper portion of the reflection coupling layer 20 and the optical mode alignment layer 50, that is, the III-V compound semiconductor (active layer 71) and the upper mirror structure. The optical waveguide 30 connected to the reflection coupling layer 20 at the lower side and the optical mode alignment layer 50 are formed by a semiconductor manufacturing process having high accuracy and precision. Thus, optical alignment between a VCSEL resonance mode and a waveguide mode of the optical waveguide 30 may be accurate during the semiconductor manufacturing process.

Figure 7A:
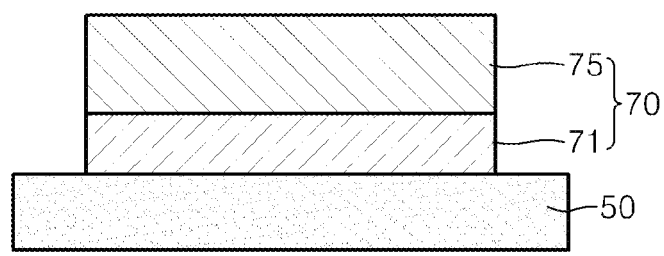
FIG. 7A is a side view schematically illustrating an upper structure bonded to an upper portion of an optical mode alignment layer.
Figure 7B:
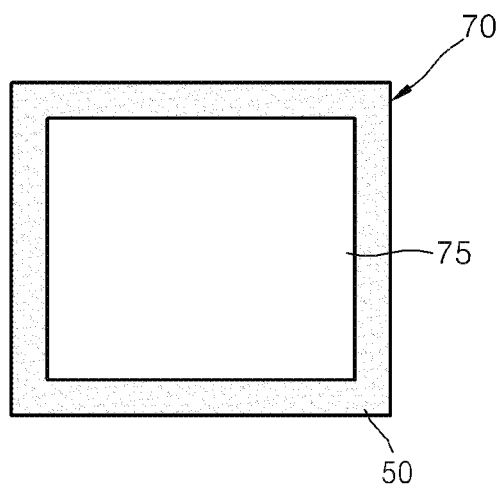
FIG. 7B is a plan view of FIG. 7A.

FIG. 7A is a side view of the upper structure 70 bonded to an upper portion of the optical mode alignment layer 50. FIG. 7B is a plan view of FIG. 7A. Referring to FIGS. 7A and 7B, the upper structure 70 may include the active layer 71 where light is generated and the reflection layer 75 provided on the active layer 71.

The active layer 71 is formed of a III-V compound semiconductor and may include a quantum well structure. The quantum well structure may have a resonant periodic gain (RPG) including a plurality of quantum wells and barrier layers between quantum wells. The active layer 71 may be provided to generate oscillation at a wavelength of about 1.31 or 1.55 µm, which is often used for optical communications. The active layer 71 may be formed of a III-V compound semiconductor material such as GaInNAs, InGaAlAs, InGaAsP, AlGaAsSb, etc., based on GaAs or InP.

The reflection layer 75, that is, the upper mirror structure, reflects light generated by the active layer 71 toward the reflection coupling layer 20 located at the lower side so that the light may resonate between the reflection layer 75 and the reflection coupling layer 20. The reflection layer 75 may have a distributed Bragg reflector (DBR) designed to have maximum reflectance at a desired resonance wavelength $\lambda$. The reflection layer 75 may be formed by alternately stacking two material layers having different refractive indexes at a thickness of about ¼ of the desired resonance wavelength $\lambda$, that is, $\lambda/4$. For example, a DBR structure may be formed by alternately stacking an $Al_xGa(1-x)As$ layer and an $Al_yGa(1-y)As$ layer (here, $0 \le x$, $y \le 1$, $x \ne y$) at a thickness of about $\lambda/4$. Also, the reflection layer 75 may have a high index contrast grating reflection layer structure having the same structure, that is, a one-dimensional grating structure, as the reflection coupling layer 20.

According to the hybrid laser light source 10 for a photonic integrated circuit according to some example embodiments, in the overall VCSEL structure, the optical mode alignment layer 50 forming a lower structure determines the type of a lower optical resonance mode of the VCSEL, and alignment of a resonance mode of the overall VCSEL structure and a waveguide mode of the optical waveguide 30 may be smoothly performed with high accuracy and precision by a semiconductor manufacturing process of forming the optical mode alignment layer 50 and the optical waveguide 30 connected to the reflection coupling layer 20, that is, a lower structure, regardless of bonding of the upper structure 70.

To check that the optical mode alignment layer 50 determines a lower resonance mode, a FDTD simulation is performed. A structure including an SOI substrate having a thickness of SiO2 of about 1 µm and a reflection coupling layer formed on an upper silicon layer of the SOI substrate and having a patterning cycle of about 0.515 µm, a width of silicon of about 0.309 µm, and a height of about 0.355 µm is used. An SiO2 gap layer having a thickness of about 0.183 µm is disposed on the reflection coupling layer structure. A silicon (Si) optical mode alignment layer having the shape of FIG. 3 or 5 is disposed on an upper portion of the SiO2 gap layer. The high refractive index area is designed to have a horizontal length of about 5 µm, a vertical length of about 5 µm, and a thickness of about 1.123 µm, whereas the low refractive index area is designed to be an air area having a width of about 1.5 µm. A III-V compound semiconductor layer as an active layer and nine pairs of Si/SiN DBR reflection structures as a reflection layer are located on an upper portion of the optical mode alignment layer. Thus, a vertical optical resonator that resonates at a wavelength of about 1.31 µm in a vertical direction between the reflection coupling layer at a lower side and the DBR structure at an upper side is formed. The reflection coupling layer structure is designed to have a reflectance of about 99.89% with respect to light having a wavelength of about 1.31 µm and polarized in a direction x perpendicular to a silicon bar of the reflection coupling layer of light perpendicularly incident on the reflection coupling layer, whereas the DBR structure is designed to have a reflectance of about 99.98% regardless of polarization during vertical incidence.

Figure 8:
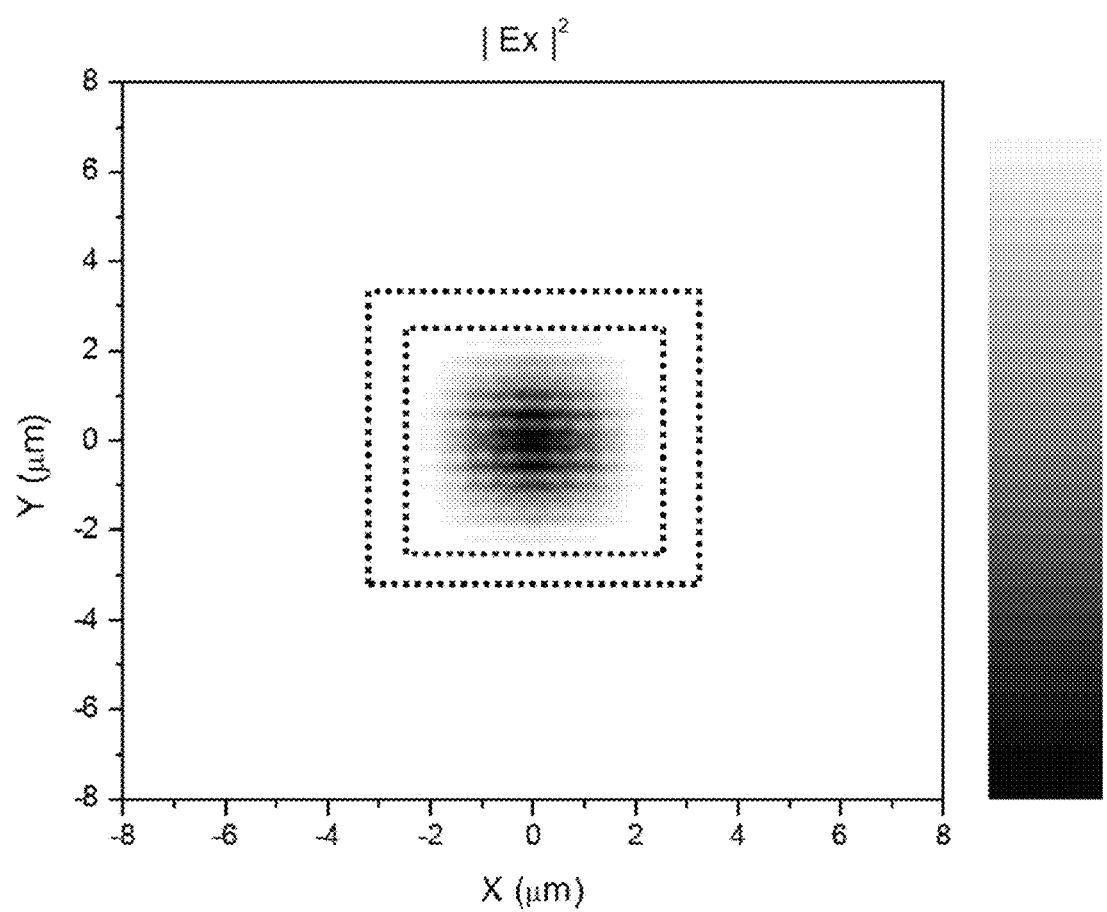
FIGS. 8 and 9 are diagrams each showing an IExI2 distribution of a center plane of an optical mode alignment layer obtained through a finite-difference time-domain (FDTD) simulation, when the optical mode alignment layer has a shape of FIG. 3 or 5.
Figure 9:
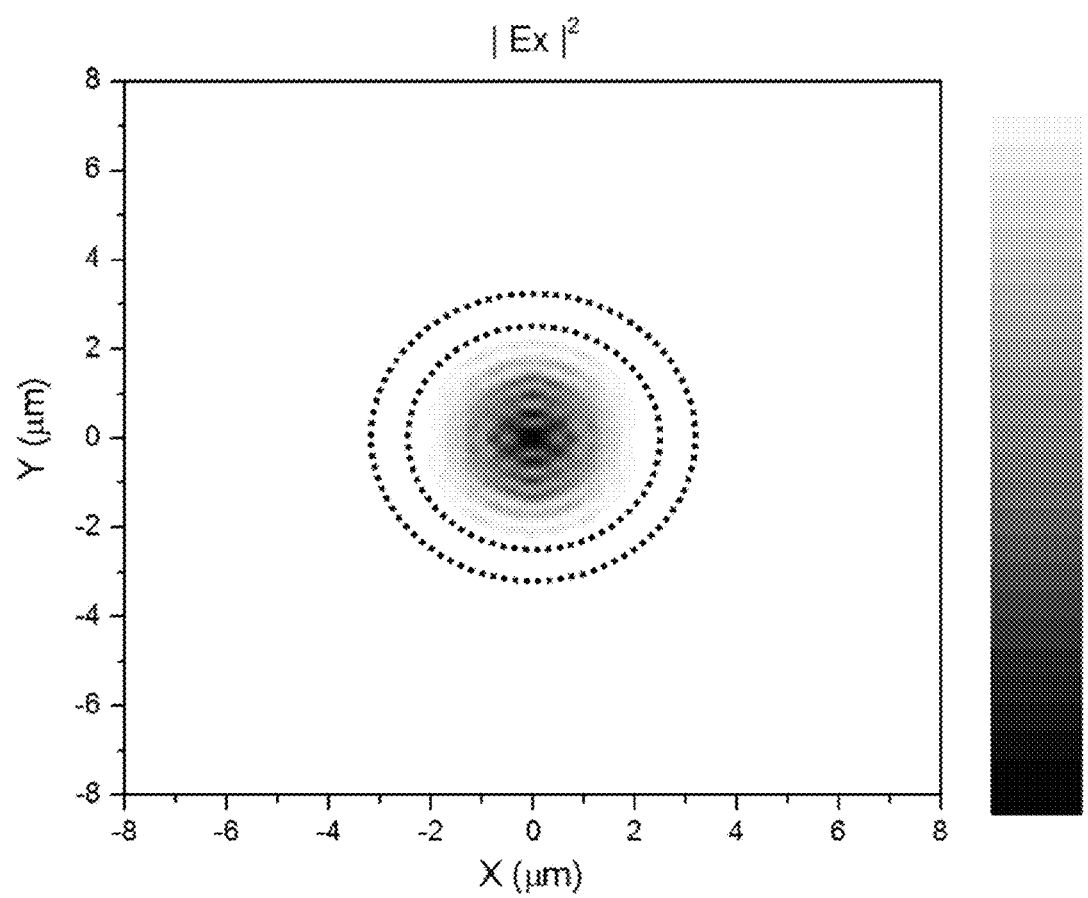

FIGS. 8 and 9 are diagrams each showing an $|Ex|^2$ distribution of a center plane of the optical mode alignment layer 50 obtained through an FDTD simulation under the above-described conditions, when the optical mode alignment layer 50 has the shape of FIG. 3 or 5. In FIGS. 8 and 9, a dotted line indicates a boundary line between a high refractive index area 51 at a center of the optical mode alignment layer 50 and the low refractive index area 55 around the high refractive index area 51. In FIGS. 8 and 9, it may be seen that the type of an optical resonance mode may be determined by the high refractive index area 51 at a center of the optical mode alignment layer 50. Since a lower optical resonance mode that determines an optical alignment state with the optical waveguide 30 is determined by the optical mode alignment layer 50, accurate alignment may be performed regardless of a bonding state of the upper structure 70.

As described above, accurate and precise optical mode alignment is possible by using the optical mode alignment layer 50 during chip bonding for directly bonding an individual VCSEL chip. Thus, the optical mode alignment layer 50 allows a chip bonding technology to be used for manufacturing a III-V compound semiconductor/silicon hybrid laser light source for a photonic integrated circuit. When the chip bonding technology is used for manufacturing a III-V compound semiconductor/silicon hybrid laser light source, a VCSEL structure may be made in an overall area of a III-V compound semiconductor substrate and thus a VCSEL chip may be bonded to each of many photonic integrated circuits for use. Thus, compared to a wafer bonding technology by which only a partial area needing a VCSEL structure is used from an overall area of a III-V compound semiconductor substrate, a manufacturing cost may be much reduced and price competitiveness may be increased. Also, a VCSEL structure having various structures and characteristics may be easily used by being bonded to a single photonic integrated circuit.

Figure 10A:
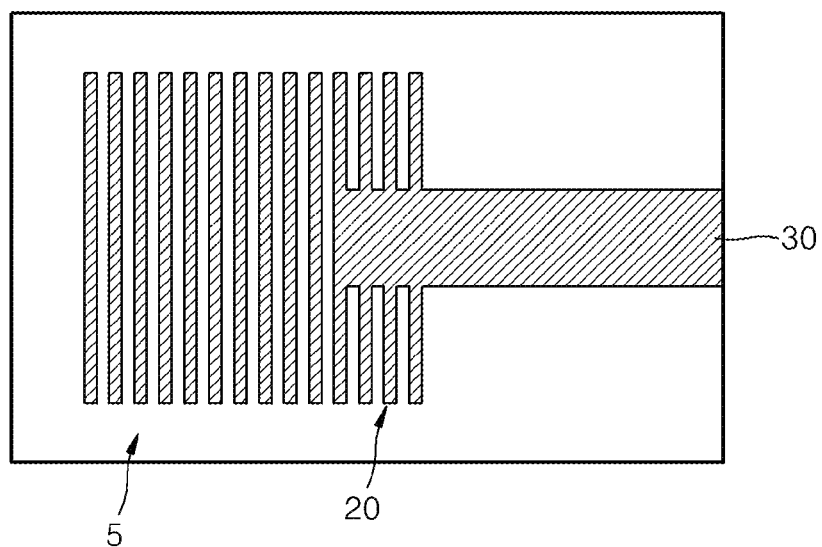
FIGS. 10A, 10B, 11A, 11B, 12A, and 12B are views illustrating a process of manufacturing a light source of a photonic integrated circuit according to some example embodiments.
Figure 10B:
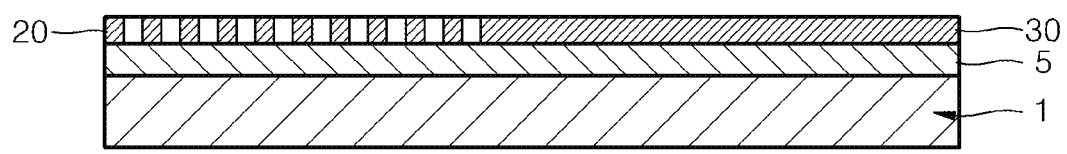
Figure 11A:
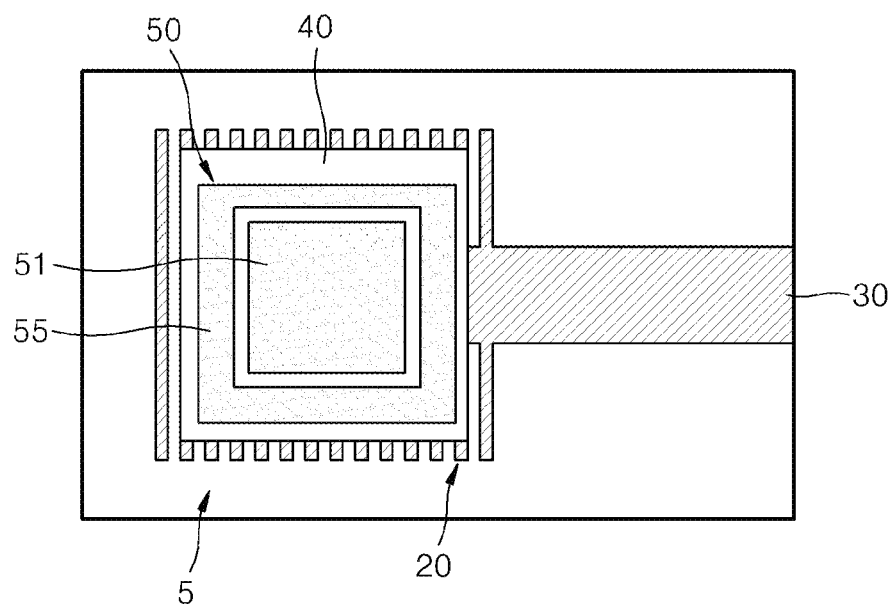
Figure 11B:
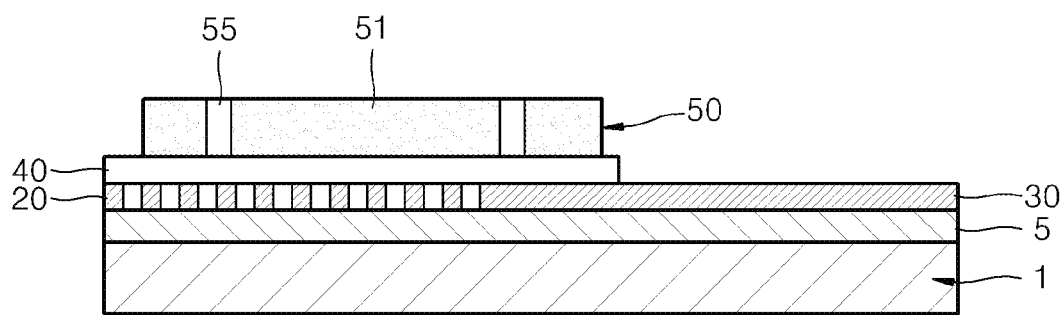
Figure 12A:
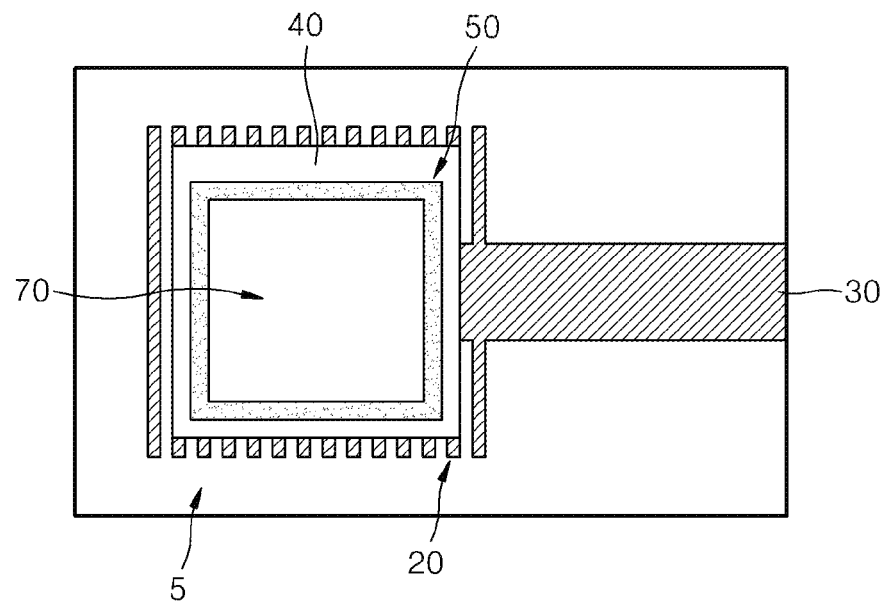
Figure 12B:
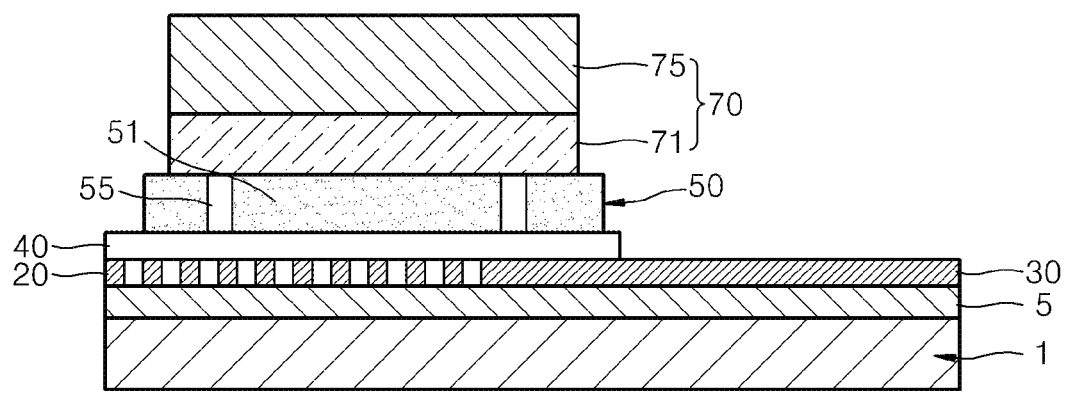

For example, the hybrid laser light source 10 for a photonic integrated circuit according to an embodiment of the present invention may be manufactured as follows. Referring to FIGS. 10A and 10B, the insulation layer 5 having low refractive index is formed on the upper surface of the substrate 1, and the reflection coupling layer 20 and the optical waveguide 30 are formed on an upper surface of the insulation layer 5 such that at least one side of the reflection coupling layer 20 is optically coupled to the optical waveguide 30. Then, as illustrated in FIGS. 11A and 11B, the optical mode alignment layer 50 is formed on the reflection coupling layer 20. When a structure includes the gap layer 40, the gap layer 40 is formed on the reflection coupling layer 20 and the optical mode alignment layer 50 is formed on the gap layer 40. Next, as illustrated in FIGS. 12A and 12B, the upper structure 70 of a chip shape including the active layer 71 for generating light and the reflection layer 75 provided on the active layer 71 is chip-bonded on the optical mode alignment layer 50 so that the hybrid laser light source 10 for a photonic integrated circuit according to some example embodiments may be obtained. Alignment of a resonance mode of an overall VCSEL structure and a waveguide mode of the optical waveguide 30 may be performed by a semiconductor manufacturing process of forming the optical mode alignment layer 50 and the optical waveguide 30 connected to the reflection coupling layer 20, that is, a lower structure.

As described above, according to a hybrid laser light source for a photonic integrated circuit according to some example embodiments, since an optical mode alignment layer is provided, accurate optical mode alignment may be possible, a coupling efficiency of a resonance mode of a resonator and a waveguide mode of an optical waveguide may be increased, and accurate optical mode alignment during wafer bonding and chip bonding may be possible.

While example embodiments have been particularly shown and described, it will be understood by those of ordinary skill in the art that various changes in form and details may be made therein without departing from the spirit and scope of the present invention as defined by the following claims.

What is claimed is:

1. A light source for a photonic integrated circuit, the light source comprising:
   a reflection coupling layer formed on a substrate in which an optical waveguide is provided, at least one side of the reflection coupling layer being optically connected to the optical waveguide;
   an optical mode alignment layer provided on the reflection coupling layer; and
   an upper structure provided on the optical mode alignment layer and including an active layer for generating light and a reflection layer provided on the active layer;
   wherein a resonator includes the reflection coupling layer and the upper structure, and
   wherein the optical mode alignment layer is provided so that a waveguide mode of the optical waveguide and a resonance mode of the resonator are aligned.

2. The light source of claim 1, wherein the optical mode alignment layer comprises a higher refractive index area arranged at a center portion and a lower refractive index area arranged around the higher refractive index area.

3. The light source of claim 2, wherein the higher refractive index area and the lower refractive index area have a refractive index difference by which optical confinement is achieved in the higher refractive index area.

4. The light source of claim 2, wherein the higher refractive index area has any one of circular, oval, and polygonal shapes.

5. The light source of claim 2, wherein the lower refractive index area has a band shape surrounding the higher refractive index area.

6. The light source of claim 5, wherein an area outside the lower refractive index area of the optical mode alignment layer is formed of a same material as the higher refractive index area.

7. The light source of claim 2, wherein the lower refractive index area has a width that is equal to or greater than a wavelength of light used for the light source.

8. The light source of claim 2, wherein an overall area outside the higher refractive index area of the optical mode alignment layer is formed as the lower refractive index area.

9. The light source of claim 2, wherein the higher refractive index area is formed of silicon, and
   wherein the lower refractive index area is formed of a silicon oxide or air.

10. The light source of claim 2, wherein the higher refractive index area is formed of a silicon oxide, and
    wherein the lower refractive index area is formed of air.

11. The light source of claim 1, wherein the active layer of the upper structure is based on a III-V compound semiconductor, and
    wherein at least one of the substrate, the reflection coupling layer, and the optical mode alignment layer is based on silicon.

12. The light source of claim 1, wherein the upper structure is coupled to the optical mode alignment layer by wafer bonding in a substrate shape or coupled to the optical mode alignment layer by chip bonding in a chip shape.

13. The light source of claim 1, wherein the reflection coupling layer functions as a lower reflection layer with respect to the reflection layer of the upper structure, and
    wherein the reflection coupling layer is a high index contrast grating reflection layer having a one-dimensional grating structure.

14. The light source of claim 1, wherein the reflection coupling layer is formed of a material including silicon in a one-dimensional grating structure.

15. The light source of claim 1, wherein an insulation layer is provided on an upper surface of the substrate, and
wherein the reflection coupling layer and the optical waveguide are provided on the insulation layer.

16. The light source of claim 1, further comprising: a gap layer that is provided between the reflection coupling layer and the optical mode alignment layer; and
has a refractive index lower than those of the reflection coupling layer and the optical waveguide.

17. The light source of claim 16, wherein the gap layer comprises silicon oxide.

18. The light source of claim 1, further comprising:
a gap layer between the optical mode alignment layer and the reflection coupling layer;
wherein the active layer is based on a III-V compound,
wherein the upper structure is coupled to the optical mode alignment layer by bonding,
wherein the substrate is a silicon substrate comprising an insulation layer on an upper surface thereof,
wherein the optical waveguide and the reflection coupling layer are provided on an upper surface of the insulation layer,
wherein at least one of the optical waveguide, the reflection coupling layer, and the optical mode alignment layer is based on silicon, and
wherein the optical mode alignment layer comprises a higher refractive index area arranged at a center portion and a lower refractive index area arranged around the higher refractive index area.

19. The light source of claim 18, wherein the higher refractive index area and the lower refractive index area have a refractive index difference by which optical confinement is achieved in the higher refractive index area.

20. The light source of claim 18, wherein the lower refractive index area has a width that is equal to or greater than a wavelength of light used for the light source.

21. The light source of claim 18, wherein the higher refractive index area of the optical mode alignment layer is formed of silicon, and
wherein the lower refractive index area is formed of a silicon oxide or air.

22. The light source of claim 18, wherein the higher refractive index area of the optical mode alignment layer is formed of a silicon oxide, and
wherein the lower refractive index area is formed of air.

23. The light source of claim 18, wherein the reflection coupling layer functions as a lower reflection layer with respect to the reflection layer of the upper structure, and
wherein the reflection coupling layer is a high index contrast grating reflection layer having a one-dimensional grating structure.

24. A photonic integrated circuit, comprising:
a substrate;
an optical waveguide formed on the substrate; and
the light source of claim 1 configured to generate light and configured to transmit the light through the optical waveguide.

25. The photonic integrated circuit of claim 24, wherein the optical mode alignment layer comprises a higher refractive index area arranged at a center portion and a lower refractive index area arranged around the higher refractive index area.

26. A photonic integrated circuit, comprising:
a substrate;
an optical waveguide formed on the substrate; and
the light source of claim 18 configured to generate light and configured to transmit the light through the optical waveguide.

27. A method of manufacturing the light source for a photonic integrated circuit of claim 1, the method comprising:
forming an optical waveguide and a reflection coupling layer, having at least one side optically connected to the optical waveguide, on a substrate;
forming an optical mode alignment layer on the reflection coupling layer; and
coupling an upper structure, including an active layer configured to generate light and a reflection layer provided on the active layer, to the optical mode alignment layer by wafer bonding or chip bonding.

28. The method of claim 27, wherein the optical mode alignment layer comprises a higher refractive index area arranged at a center portion and a lower refractive index area arranged around the higher refractive index area.

29. A method of manufacturing the light source for a photonic integrated circuit of claim 18, the method comprising:
forming an optical waveguide and a reflection coupling layer, having at least one side optically connected to the optical waveguide, on a substrate;
forming an optical mode alignment layer on the reflection coupling layer; and
coupling an upper structure, including an active layer for generating light and a reflection layer provided on the active layer, to the optical mode alignment layer by wafer bonding or chip bonding.

30. A light source for a photonic integrated circuit, the light source comprising:
a lower reflection layer;
an optical waveguide optically connected to the lower reflection layer;
an optical mode alignment layer on the lower reflection layer;
an active layer on the optical mode alignment layer; and
an upper reflection layer on the active layer;
wherein a resonator includes the lower reflection layer, the active layer, and the upper reflection layer, and
wherein the optical mode alignment layer is provided so that a waveguide mode of the optical waveguide and a resonance mode of the resonator are aligned.

31. The light source of claim 30, further comprising:
a gap layer between the lower reflection layer and the optical mode alignment layer.

* * * * *